(12) United States Patent
Setsuhara et al.

(10) Patent No.: US 8,916,034 B2
(45) Date of Patent: Dec. 23, 2014

(54) THIN-FILM FORMING SPUTTERING SYSTEM

(75) Inventors: Yuichi Setsuhara, Suita (JP); Akinori Ebe, Kyoto (JP); Jeon Geon Han, Songpa-gu (KR)

(73) Assignee: EMD Corporation, Shiga (JP)

( * ) Notice: Subject to any disclaimer, the term of this patent is extended or adjusted under 35 U.S.C. 154(b) by 9 days.

(21) Appl. No.: 13/059,318

(22) PCT Filed: Aug. 25, 2009

(86) PCT No.: PCT/JP2009/004092
§ 371 (c)(1),
(2), (4) Date: May 3, 2011

(87) PCT Pub. No.: WO2010/023878
PCT Pub. Date: Mar. 4, 2010

(65) Prior Publication Data
US 2011/0203922 A1      Aug. 25, 2011

(30) Foreign Application Priority Data
Aug. 28, 2008  (JP) .................................. 2008-218946

(51) Int. Cl.
*C23C 14/35* (2006.01)
*H01J 37/34* (2006.01)
*H01J 37/32* (2006.01)
*C23C 14/34* (2006.01)

(52) U.S. Cl.
CPC ......... *H01J 37/3408* (2013.01); *H01J 37/3411* (2013.01); *H01J 37/3211* (2013.01); *H01J 37/3417* (2013.01); *C23C 14/358* (2013.01); *C23C 14/3407* (2013.01); *H01J 37/321* (2013.01)
USPC ................................. 204/298.06; 204/298.19

(58) Field of Classification Search
CPC ........................... H01J 37/3438; H01J 37/3211
USPC ......................................... 204/298.06, 298.19
See application file for complete search history.

(56) References Cited

U.S. PATENT DOCUMENTS 5,417,834 A     5/1995  Latz
5,431,799 A *   7/1995  Mosely et al. ........... 204/298.06
(Continued)

FOREIGN PATENT DOCUMENTS

EP        0 653 776 A1      5/1995
JP        A 10-289887       10/1998
(Continued)

OTHER PUBLICATIONS

Aug. 15, 2012 Chinese Office Action issued in Chinese Patent Application No. 200980133584.7 (with translation).

(Continued)

*Primary Examiner* — Rodney McDonald
(74) *Attorney, Agent, or Firm* — Oliff PLC (57) ABSTRACT

A thin-film forming sputtering system capable of a sputtering process at a high rate. A thin-film forming sputtering system includes: a vacuum container; a target holder located inside the vacuum container; a target holder located inside the vacuum container; a substrate holder opposed to the target holder; a power source for applying a voltage between the target holder and the substrate holder; a magnetron-sputtering magnet provided behind the target holder, for generating a magnetic field having a component parallel to a target; and radio-frequency antennae for generating radio-frequency inductively-coupled plasma within a space in the vicinity of the target where the magnetic field generated by the magnetron-sputtering magnet has a strength equal to or higher than a predetermined level. The radio-frequency inductively-coupled plasma generated by the radio-frequency antennae promotes the supply of electrons into the aforementioned magnetic field, so that the sputtering process can be performed at a high rate.

10 Claims, 6 Drawing Sheets

(56) References Cited

U.S. PATENT DOCUMENTS

| | | | |
|---|---|---|---|
| 5,968,327 A * | 10/1999 | Kobayashi et al. | 204/298.11 |
| 6,936,144 B2 * | 8/2005 | Weiler et al. | 204/298.06 |
| 2007/0144672 A1 | 6/2007 | Kato et al. | |

FOREIGN PATENT DOCUMENTS

| | | |
|---|---|---|
| JP | A 11-269643 | 10/1999 |
| JP | A 2000-273629 | 10/2000 |
| JP | A 2001-35697 | 2/2001 |
| JP | A 2003-313662 | 11/2003 |
| JP | A 2007-080999 | 3/2007 |
| JP | A 2007-149638 | 6/2007 |
| WO | WO 01/63000 A2 | 8/2001 |
| WO | WO 2008/014196 A2 | 1/2008 |

OTHER PUBLICATIONS

Hyoujun Gijutsu-shu (Standard Technologies Collection), "Handoutai Seizousouchi Kanren Shinkuu-Kuriin-ka Gijutsu (Vacuum and Cleaning Techniques for Semiconductor Manufacturing Equipment)", Section 1-7-1, "Magunetoron Supattaringu Souchi (Magnetron Sputtering System)", issued by Japan Patent Office, 2003.

International Search Report issued in PCT/JP2009/004092, mailed Nov. 17, 2009. (with English-language translation).

Written Opinion issued in PCT/JP2009/004092, mailed Nov. 17, 2009. (with English-language translation).

Chinese Office Action dated Mar. 4, 2013 issued in Chinese Application No. 200980133584.7 (with translation).

Jun. 28, 2013 Office Action issued in Chinese Patent Application No. 200980133584.7 (with translation).

Oct. 24, 2013 extended European Search Report issued in Patent Application No. 09809534.2.

Nov. 26, 2013 Office Action issued in Japanese Patent Application No. 2010-526534 (with translation).

May 12, 2014 Office Action issued in Taiwanese Patent Application No. 98128935 (with English translation).

Chinese Office Action issued in Chinese Patent Application No. 200980133584.7 dated Jan. 13, 2014 (w/ translation).

Sep. 16, 2014 Office Action issued in Japanese Patent Application No. 2010-526534 (with English-language translation).

* cited by examiner

THIN-FILM FORMING SPUTTERING SYSTEM

TECHNICAL FIELD

The present invention relates to a thin-film forming sputtering system for forming a thin film with a predetermined thickness on the surface of a substrate by sputtering a target by using plasma.

BACKGROUND ART

A parallel-plate type thin-film forming sputtering system having a metallic sputtering target (cathode) and a substrate arranged parallel to each other within a vacuum chamber has been often used for forming a thin film. In this type of system, an argon gas or similar inert gas is introduced into the vacuum chamber, and a direct-current voltage or radio-frequency voltage is applied to the sputtering target to generate plasma within the vacuum chamber. The target is sputtered by the ions in the plasma so as to form a desired thin film on the surface of the substrate.

An example of the thin-film forming sputtering system capable of forming a thin film at a high rate is a magnetron sputtering system (refer to Non-Patent Document 1). The magnetron sputtering system has an electromagnet or permanent magnet placed behind the target to generate a magnetic field parallel to the surface of the target. This magnetic field is combined with an electric field generated by the direct-current voltage or radio-frequency voltage applied to the target, to produce a cycloidal motion or trochoidal motion of electrons. (These motions are hereinafter collectively referred to as the "cycloid-trochoidal motion.") This motion of electrons is utilized to generate plasma in a localized form near the surface of the target and thereby increase the plasma density on the surface of the target so that the target will be efficiently sputtered. As compared to the systems that utilize no magnetic field, the magnetron sputtering system has various advantages, such as a higher film-formation rate, stronger adhesion of the film, and less damage to the substrate by virtue of the smaller increase in the temperature of the substrate.

Patent Document 1 discloses a magnetron sputtering system in which a radio-frequency coil is used to create plasma within a space through which the particles sputtered from the target pass to reach the surface of the substrate. While passing through this plasma, the sputtered particles are ionized, and the resulting ions are pulled toward the substrate due to the effect of the aforementioned electric field. Thus, the film is efficiently formed at a high rate.

However, even the aforementioned conventional magnetron sputtering systems cannot sufficiently increase the plasma density in the vicinity of the surface of the target to achieve an adequately high sputtering rate.

The film-formation rate can be improved to some extent by strengthening the electric field applied to the target (the target bias). However, this operation unfavorably increases the damage to the substrate (the plasma damage) caused by the ions impinging on the substrate after colliding with the target with high energy and being recoiled toward the substrate.

Furthermore, in the case of a reactive sputtering which is performed when a thin oxide film needs to be formed, an oxide coating is formed on the surface of the target due to the reaction with oxygen, causing the electrical charge-up of the surface of the target, which relaxes the electric field on the target's surface and eventually lowers the plasma density. As a result, the film formation rate considerably decreases. Thus, with the conventional thin-film forming sputtering systems, it is difficult to form a thin oxide film at a high rate.

Meanwhile, an inductively-coupled sputtering system using radio-frequency antennae has been recently under study. Patent Document 2 discloses an inductively-coupled sputtering system having a vacuum chamber containing two U-shaped radio-frequency antennae with a target surrounding these antennae. According to this document, the inductively coupled sputtering system can be used to create silicon dots (silicon nanoparticles) having an extremely small diameter (16 nm in one embodiment) on a substrate. In this system, inductively-coupled plasma is formed by the radio-frequency antennae, and this plasma has a high density in the vicinity of the radio-frequency antennae. However, the technique described in Patent Document 2 is not aimed at high-speed film formation. Actually, by this technique, it is impossible to intensively increase the plasma density on the surface of the target since the plasma diffuses rom the radio-frequency antennae in all directions, so that the film-formation rate cannot be sufficiently high. For these reasons, the inductively-coupled sputtering system described in Patent Document 2 which is capable of creating extremely small structures (such as the silicon nanoparticles), is impractical for the creation of relatively large structures, such as a thin film having a thickness on the order of micrometers.

BACKGROUND ART DOCUMENT

Patent Document

Patent Document 1: JP-A 10-289887 (Paragraphs [0006]-[0007], [0016]-[0017] and FIG. 1)

Patent Document 2: JP-A 2007-080999 (Paragraphs [0104]-[0111] and FIGS. 6-7)

NON-PATENT DOCUMENT

Non-Patent Document 1: *Hyoujun Gijutsu-shu (Standard Technologies Collection)*, "Handoutai Seizousouchi Kanren Shinkuu-Kuriin-ka Gijutsu (Vacuum and Cleaning Techniques for Semiconductor Manufacturing Equipment)", Section 1-7-1, "Magunetoron Supattaringu Souchi (Magnetron Sputtering System):, 2003, issued by Japan Patent Office.

DISCLOSURE OF THE INVENTION

Problem to Be Solved By the Invention

The problem to be solved by the present invention is to provide a thin-film forming sputtering system capable of performing the sputtering process at higher rates than ever before.

Means for Solving the Problems

A thin-film forming sputtering system according to the present invention aimed at solving the aforementioned problem is characterized by including:

a) a vacuum container;
b) a target-holding means provided inside the vacuum container;
c) a substrate-holding means opposed to the target-holding means;
d) a plasma-generating gas introducing means for introducing a plasma-generating gas into the vacuum container;

e) an electric-field generating means for generating a direct-current electric field or radio-frequency electric field between the target-holding means and the substrate-holding means;

f) a magnetic-field generating means for generating a magnetic field on a sputter target held by the target-holding means, the magnetic field containing a component parallel to the surface of the sputter target; and g) a radio-frequency inductively-coupled plasma generating means for generating radio-frequency inductively-coupled plasma in the vicinity of the sputter target and within a space where the magnetic field generated by the magnetic field generation means and having a strength equal to or higher than a predetermined strength is present.

In the thin-film forming sputtering system according to the present invention, inductively-coupled plasma composed of ionized plasma-generating gas is generated in the vicinity of the sputter target by the radio-frequency inductively-coupled plasma generating means, in addition to the plasma composed of ionized molecules of the plasma-generating gas locally generated on the surface of the sputter target by the electric-field generating means and the magnetic-field generating means in a similar manner to the conventional magnetron sputtering system. Thus, the plasma generated by the electric-field generating means and the magnetic-field generating means, as well as the inductively-coupled plasma, are combined together on the surface of the target to form extremely dense plasma. As a result, the sputtering proceeds at higher rates.

As just described, the thin-film forming sputtering system according to the present invention performs the sputtering at a high rate. Therefore, in the process of forming a thin oxide film, the oxide on the surface of the target is quickly removed by the sputtering before the surface is covered with the oxide. The sputtering can be continued for a long period of time in the "metal mode" in which the metal is exposed on the surface of the target. Even if the target's surface is covered with the oxide, the sputtering further continues since the radio-frequency inductively-coupled plasma generating means generates plasma without being influenced by the oxide on the surface.

The strength of the magnetic field within the region where the radio-frequency inductively-coupled plasma is generated by the radio-frequency inductively-coupled plasma generating means (i.e. the aforementioned "predetermined strength") is set to be equal to or higher than a strength necessary for producing the cycloid-trochoidal motion of electrons (e.g. 0.1 tesla). In order to efficiently produce the cycloid-trochoidal motion, the magnetic field should preferably be generated parallel to the surface of the sputter target or as close to parallel to that surface as possible.

A preferable example of the radio-frequency inductively-coupled plasma generating means is a radio-frequency antenna disclosed in JP-A 2001-35697, which consists of a U-shaped or arc-shaped conductive wire. In the case of using this type of antenna, it is preferable to arrange the radio-frequency antenna in such a manner that the conductive wire of the radio-frequency antenna intersects with the aforementioned magnetic field being generated by the magnetic-field generating means and having a strength equal to or higher than the predetermined strength.

Effect of the Invention

With the thin-film forming sputtering system according to the present invention, it is possible to increase the plasma density in the vicinity of the surface of the target and thereby produce a large number of ions, so that the sputtering can be performed at higher rates.

BEST MODES FOR CARRYING OUT THE INVENTION

Embodiments of the thin-film forming sputtering system according to the present invention are hereinafter described by means of FIGS. 1A-9.

First Embodiment

Figure 1A:
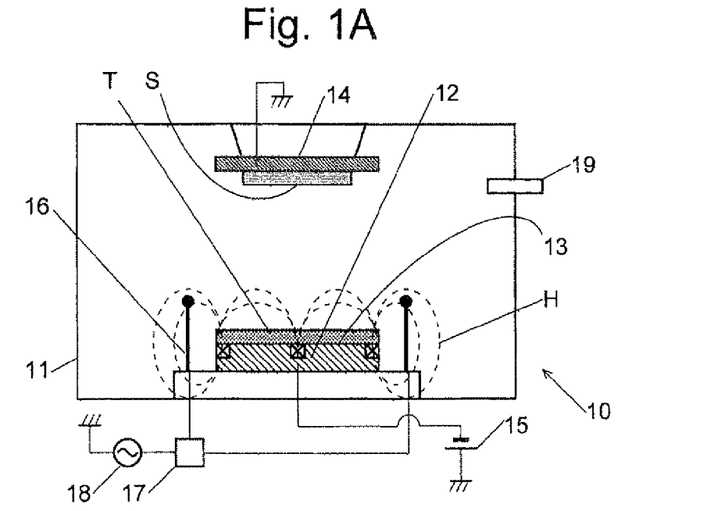
FIGS. 1A and 1B are a vertical sectional view and plan view of a thin-film forming sputtering system 10 according to the first embodiment of the present invention.
Figure 1B:
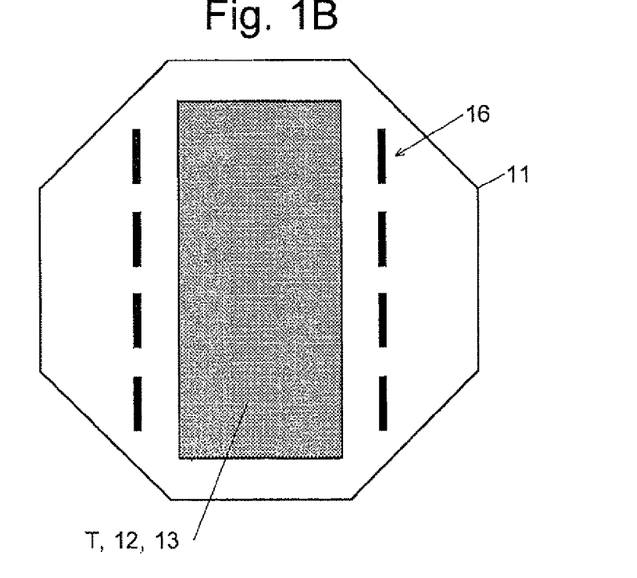

FIGS. 1A and 1B show a vertical sectional view and plan view of a thin-film forming sputtering system 10 according to the first embodiment of the present invention. It should be noted that a substrate holder 14, which will be described later, is shown only in FIG. 1A and omitted from FIG. 1B. This thin-film forming sputtering system 10 includes a vacuum container 11 whose internal space can be evacuated by a vacuum pump (not shown), a plasma-generating gas introducing device 19 for introducing plasma-generating gas into the vacuum container, a magnetron-sputtering magnet (magnetic-field generating means) 12 consisting of an electromagnet attached to the inner surface of the bottom of the vacuum container 11, a target holder (target-holding means) 13 provided on the upper surface of the magnetron-sputtering magnet 12, and a substrate holder (substrate-holding means) 14 opposed to the target holder 13. In the present embodiment, the upper surface of the magnetron-sputtering magnet 12 functions as the target holder 13. A plate-shaped target T can be placed on the upper surface of the target holder 13, while a substrate S can be attached to the lower surface of the substrate holder 14. Furthermore, the thin-film forming sputtering system 10 is provided with a direct-current power source (electric-field generating means) 15 for applying a direct-current voltage between the target holder 13 and the substrate holder 14, with the target holder 13 on the positive side. In the present embodiment, the substrate holder 14 is designed to hold a rectangular substrate S. Similarly, the target holder 13 is designed to hold a rectangular target T. The vacuum container 11, magnetron-sputtering magnet 12, target holder 13 and substrate holder 14 are basically the same as those used in conventional magnetron sputtering systems.

Figure 2A:
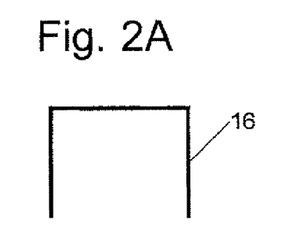
FIGS. 2A and 2B are plan views of one example of the radio-frequency antenna used in the thin-film forming sputtering system according to the present invention.
Figure 2B:
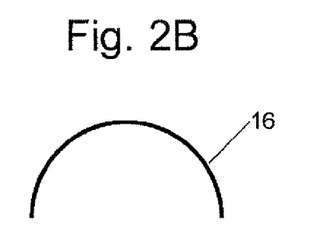

A plurality of radio-frequency antennae (radio-frequency inductively-coupled plasma-generating means) 16 are provided on at least one side of the target holder 13. These radio-frequency antennae 16 are located within a space where the strength of the magnetic field created by the magnetron-sputtering magnet 12 (indicated by the numeral H in FIG. 1A) is equal to or higher than 0.02 T (tesla). The present system has a total of eight radio-frequency antennae 16 arranged along the long sides of the target T, with four antennae on each side. These radio-frequency antennae 16 are connected via an impedance matching unit 17 to a radio-frequency power source 18. In the present embodiment, a U-shaped conductive wire, as shown in FIG. 2A, is used as the radio-frequency antenna 16. It is also possible to use an arc-shaped radio-frequency antenna as shown in FIG. 2B. Both the U-shaped radio-frequency antenna and the arc-shaped radio-frequency antenna are a coil whose number of turns is less than one. Such a coil has a smaller inductance than a coil whose number of turns is equal to or larger than one, and accordingly lowers the voltage that occurs in the antenna when a predetermined radio-frequency power is supplied. Thus, the plasma can be efficiently generated.

An operation of the thin-film forming sputtering system 10 of the present embodiment is hereinafter described. Initially, a target T and a substrate S are respectively attached to the target holder 13 and the substrate holder 14. Next, the vacuum container 11 is evacuated by using the vacuum pump, after which a gas for generating plasma (the plasma-generating gas) is introduced into the vacuum container 11 until the pressure inside this container reaches a predetermined level. Subsequently, a direct-current is passed through the electromagnet of the magnetron-sputtering magnet 12, whereby a magnetic field H is created from the magnetron-sputtering magnet 12, spreading in the vicinity of the target T and within a space including the conductive wires of the radio-frequency antennae 16. Concurrently, using the target holder 13 and the substrate holder 14 as two electrodes, a direct-current voltage supplied from the direct-current power source 15 is applied between the two electrodes to create a direct-current electric field between them. Furthermore, a radio-frequency power is supplied from the radio-frequency power source 18 to the radio-frequency antennae 16 to create a radio-frequency electromagnetic field around the radio-frequency antennae 16.

Due to the effect of the aforementioned magnetic field and the direct-current electric field, plasma is generated in the vicinity of the target, which is similar to the case of the conventional magnetron sputtering systems. Additionally, inductively-coupled plasma is created by the radio-frequency antennae 16. The two kinds of plasma respectively supply electrons, which make a cycloid-trochoidal motion due to the effects of the aforementioned magnetic field and the direct-current electric field, promoting the ionization of the molecules of the plasma-generating gas. Thus, a large amount of cations are produced. These cations collide with the surface of the target T, causing the sputtering of particles from the surface of the target T. The sputtered particles fly through the space between the target T and the substrate 5, and adhere to the surface of the substrate S. Thus, the sputtered particles are deposited on the surface of the substrate S to form a thin film.

In the thin-film forming sputtering system 10 according to the present embodiment, electrons and ions are supplied from both the plasma generated by the device similar to the conventional magnetron-sputtering system and the inductively-coupled plasma generated by the radio-frequency antennae 16, whereby high-density plasma is created on the surface of the target T. This plasma accelerates the sputtering of the target T and thereby increases the film-formation rate.

In the thin-film forming sputtering system 10 according to the present embodiment, if the substrate holder 14 is provided within the range of influence of the plasma generated by the radio-frequency antennae 16, the surface of the substrate S will be activated by the radio-frequency electromagnetic field. This is effective for improving the film quality. It also allows the film-forming temperature to be lowered so that a thin film can be formed even on a low heat resistance substrate.

The result of an experiment using the thin-film forming sputtering system 10 of the present embodiment is hereinafter described. In this experiment, an electric current produced by the ions impinging on the target (the ion current) was measured while the direct-current voltage applied between the target holder 13 and the substrate holder 14 was varied, with an amount of power constantly supplied to the radio-frequency antennae 16. For comparison, another experiment was also performed with the thin-film forming sputtering system 10, in which the relationship between the direct-current voltage and the ion current was determined with no power supply to the radio-frequency antennae 16. This comparative experiment is equivalent to the case of using a conventional direct-current magnetron sputtering system.

The specific conditions of these experiments were as follows: The target T was a rectangular copper plate measuring 375 mm in length and 120 mm in width. Argon gas was used as the plasma-generating gas. The pressure of the plasma-generating gas inside the vacuum container was 0.133 Pa (1 mTorr). A total of 2 kW of radio-frequency power was supplied to the eight radio-frequency antennae 16. (No power was supplied to the radio-frequency antennae in the comparative experiment).

Figure 3:
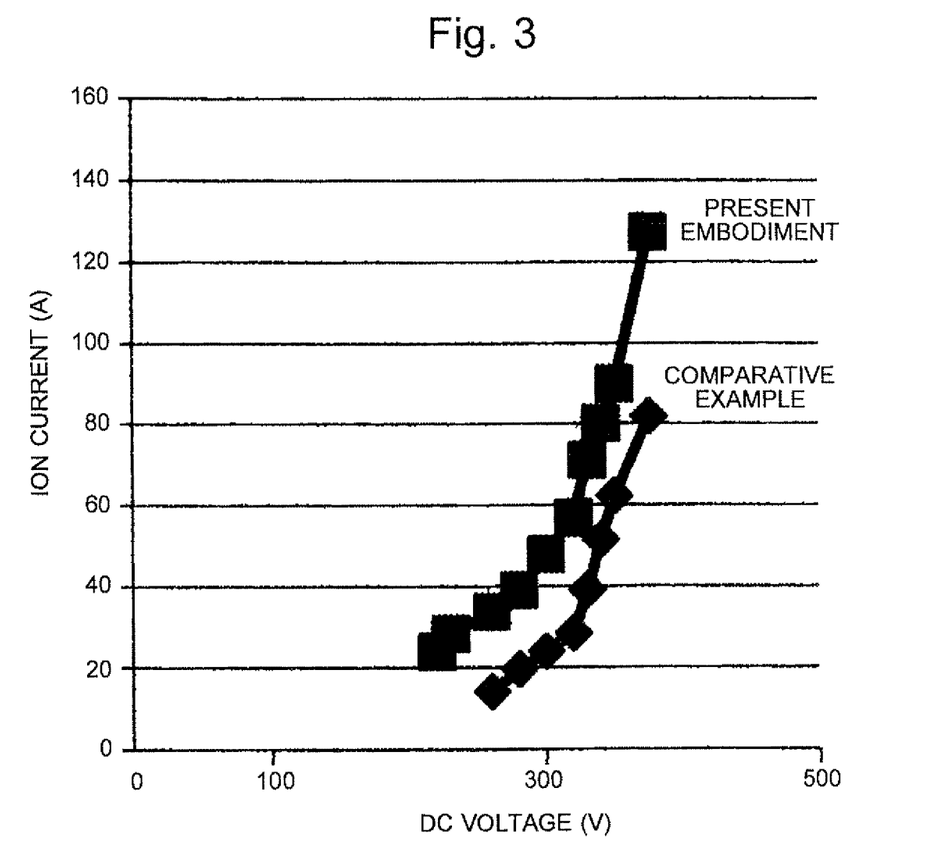
FIG. 3 is a graph showing the result of a measurement in which the relationship between the direct-current voltage and the ion current was determined for both the first embodiment and a comparative example.

The results of these experiments are shown in FIG. 3. These results demonstrate that the ion-current values in the present embodiment were 1.5 to 2.0 times as large as the values in the comparative example over the entire direct-current range for which the measurements were performed. It is generally known that the sputtering rate is proportional to the magnitude of the ion current, i.e. the number of ions impinging on the surface of the target T. Therefore, it can be said that the thin-film forming sputtering system of the present embodiment is capable of performing the sputtering process at a rate 1.5 to 2.0 times as high as the sputtering rate in the comparative example.

Second Embodiment

Figure 4A:
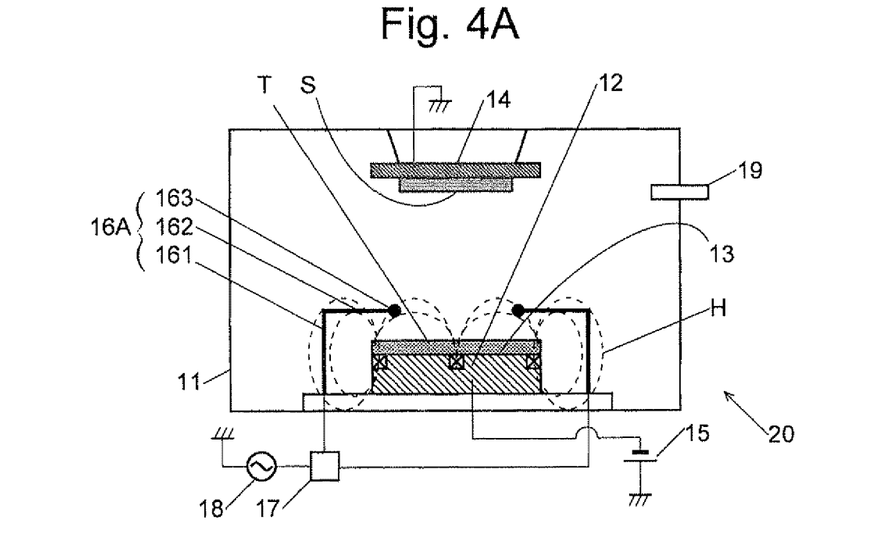
FIGS. 4A and 4B are a vertical sectional view and plan view of a thin-film forming sputtering system 20 according to the second embodiment of the present invention.
Figure 4B:
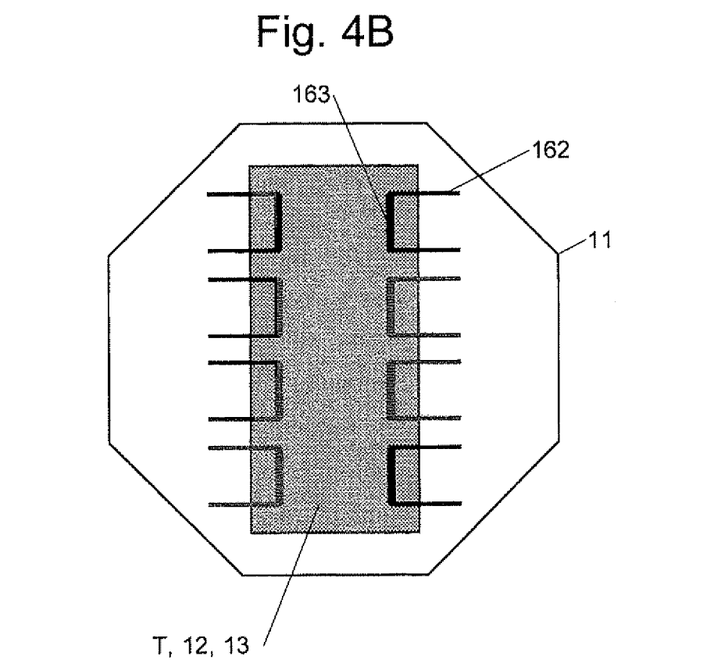

FIGS. 4A and 4B show a vertical sectional view and plan view of a thin-film forming sputtering system 20 of the second embodiment. In this embodiment, the U-shaped radio-frequency antennae 16 used in the first embodiment are replaced by radio-frequency antennae 16A having a different shape. More specifically, each radio-frequency antenna 16A has a shape composed of two straight legs (first conductors) 161 extending upwards from the inner wall surface of the bottom of the vacuum container 11, two straight arms (second conductors) 162 respectively extending from the two straight legs 161 in a direction approximately parallel to the plate-shaped target T and toward the target T, and a third conductor 163 straightly connecting the tips of the two arms 162. With such a shape and arrangement, the radio-frequency antennae 16A overhang the area in the vicinity of the surface of the target T from the at least one side of the target T. This design is capable of creating a stronger radio-frequency electromagnetic field near the surface of the target T than in the case where the radio-frequency antennae are entirely receded from the at least one side of the target holder 13. Except for these radio-frequency antennae 16A, the present system has the same configuration as that of the thin-film forming sputtering system 10 in the first embodiment.

Third Embodiment

Figure 5:
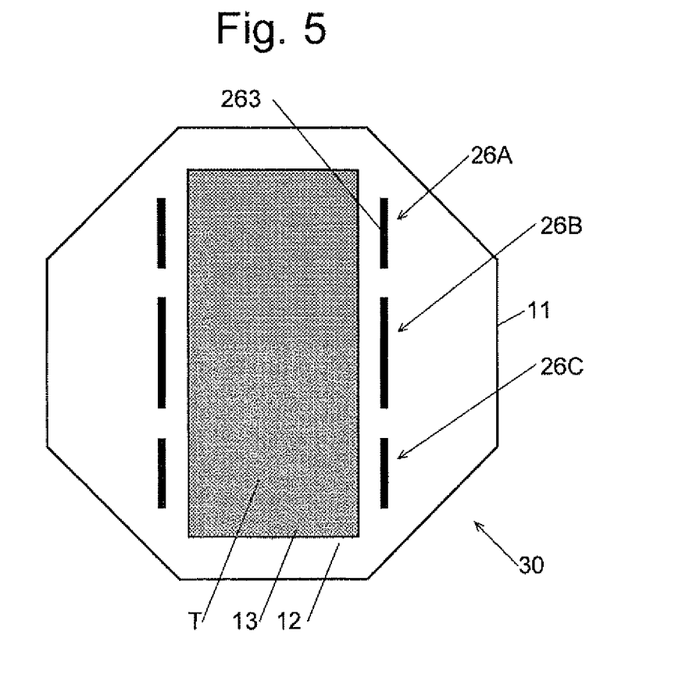
FIG. 5 is a plan view of a thin-film forming sputtering system 30 according to the third embodiment of the present invention.
Figure 6A:
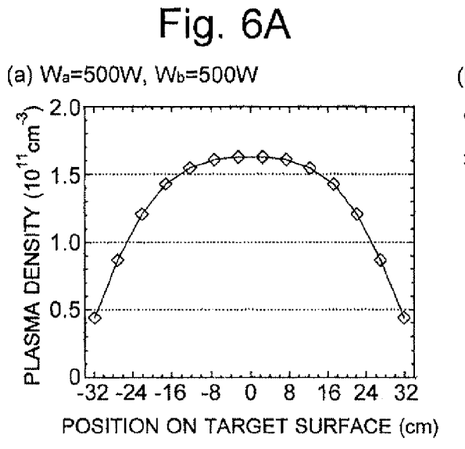
FIGS. 6A to 6D are graphs showing the result of a measurement of the plasma density in the vicinity of the target T in the third embodiment.
Figure 6B:
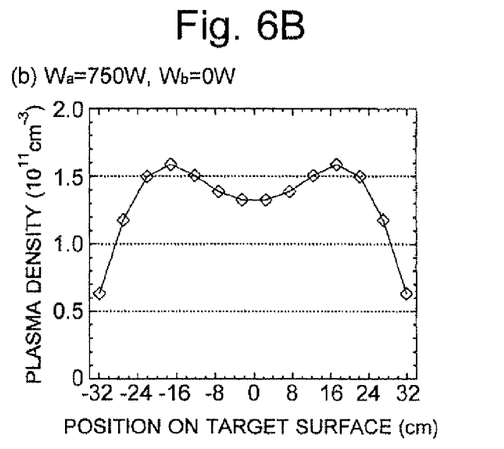
Figure 6C:
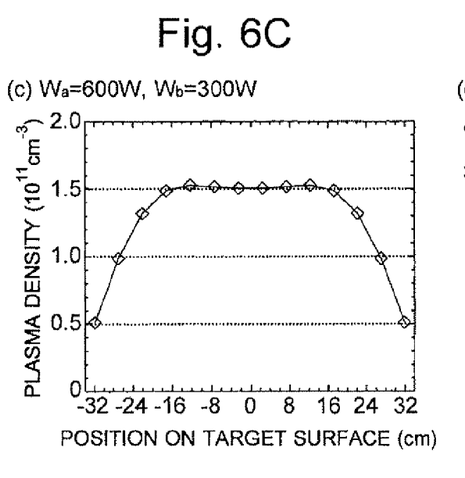
Figure 6D:
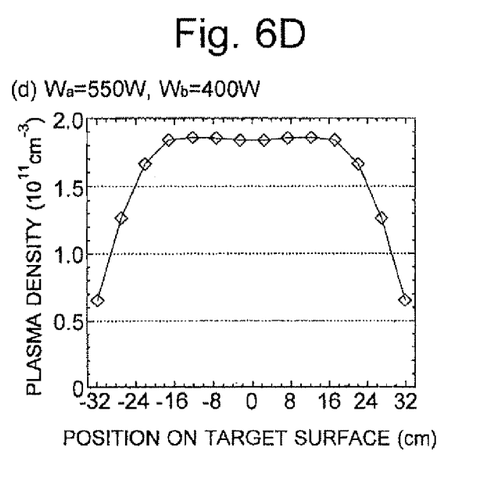

FIG. 5 shows a plan view of a thin-film fanning sputtering system 30 according to the third embodiment. In the thin-film forming sputtering system 30 of the present embodiment, the vacuum container 11, magnetron-sputtering magnet 12, target holder 13 and substrate holder 14 are the same as those used in the first and second embodiments. The present system has a total of six radio-frequency antennae 26 arranged along the long sides of the target T, with three antennae 26 on each side. Similar to the radio-frequency antenna 16 in the first embodiment, the present radio-frequency antenna 26 is U-shaped. The present antennae differ from the radio-frequency antennae 16 in the first embodiment in that the length of the third conductor 263 is not the same for all the radio-frequency antennae. More specifically, among the first, second and third radio-frequency antennae 26A, 26B and 26C arranged on the long side of the target T, the third conductors of the first and third radio-frequency antennae 26A and 26C located at both ends are shorter than that of the second radio-frequency antennae 26B located between them. The reason for this design will be explained later. No vertical sectional view of the thin-film forming sputtering system 30 of the present embodiment is shown since it is basically the same as that of the first embodiment.

In the thin-film forming sputtering system 30 of the present embodiment, the density distribution of the plasma generated inside the vacuum container 11 is controlled by adjusting the radio-frequency power supplied to the first through third radio-frequency antennae 26A-26C. The spatial gradient of the plasma density at a point near the ends (walls) of the vacuum container 11 is normally steeper than that at a point near the center of the container. Accordingly, as already noted, the third conductors of the first and third radio-frequency antennae 26A and 26C in the present embodiment are made to be shorter than that of the second radio-frequency antenna 26B so that the density near the ends of the vacuum container 11 can be minutely controlled.

An experiment using the thin-film forming sputtering system 30 of the present embodiment was conducted. In this experiment, the density of the plasma generated inside the vacuum container 11 while the thin-film forming sputtering system 30 was in use was measured. The measurement conditions were as follows: A container having a regular-hexagonal horizontal section was used as the vacuum container 11. The distance between the opposite sides of the regular hexagon was 68 cm. The length of the long side of the target T was 58 cm. The substrate S was 15 cm apart from the target T and fixed to the substrate holder 14. The length of the third conductors of the first and third radio-frequency antennae 26A and 26C was 9.8 cm, while that of the second radio-frequency antenna 26B was 14.7 cm. During the plasma-generating process, argon gas of 0.667 Pa (5 mTorr) was introduced into the vacuum container 11, and then a direct-current voltage of 300 V was applied between the target holder 13 and the substrate holder 14. Additionally, a radio-frequency power was supplied to the first through third radio-frequency antennae 26A-26C. The experiment was performed four times under the following power-supply conditions: (a) $(W_a, W_b)$ = (500 W, 500 W), (b) $(W_a, W_b)$=(750 W, 0W), (c) $(W_a, W_b)$= (600 W, 300 W), and (d) $(W_a, W_b)$=(550 W, 400 W), where $W_a$ is the radio-frequency power supplied to the first and third radio-frequency antennae 26A and 26C, and $W_b$ is the radio-frequency power supplied to the second radio-frequency antenna 26B. Under any of these conditions, the total of the power supplied to the three radio-frequency antennae arranged along one long side of the target T was (2 $W_a$+ $W_b$)=1500 W, with a total power of 3000 W supplied to the entire group of the radio-frequency antennae (i.e. the six antennae).

FIGS. 6A to 6D show the results of the measurement of the plasma density distribution in the vicinity of the target T. In the case of the condition (a) where the power was equally supplied to all the radio-frequency antennae, the plasma density measured along a line parallel to the long side of the target T exhibited a distribution that reached the maximum level at the center of the target T and gradually declined toward both ends. In the case of the condition (b) where the radio-frequency power was supplied to only the first and third radio-frequency antennae 26A and 26C at both ends of the long side of the target T, the plasma density exhibited a distribution that was curved downwards at the central portion of the long side. On the other hand, in the case of the condition (c) or (d), the plasma density was approximately constant within a range of ±20 cm along a line parallel to the long sides of the target T.

Figure 7:
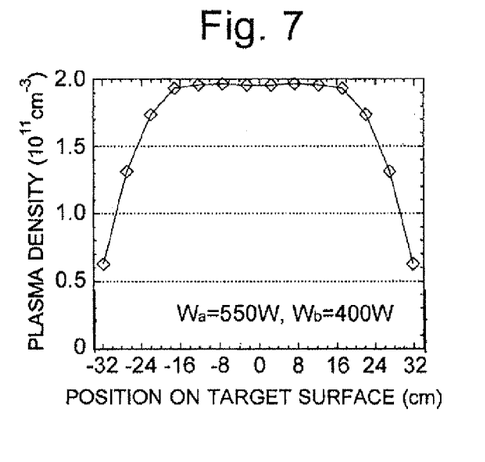
FIG. 7 is a graph showing the result of a measurement of the plasma density in the vicinity of the substrate S in the third embodiment.

The plasma density distribution near the surface of the substrate S was also measured under the condition (d). As shown in FIG. 7, the plasma density was approximately constant within a range of ±20 cm, which was similar to the plasma density near the surface of the target T.

As described thus far, it is possible to create plasma with a high level of spatial uniformity by adjusting the radio-frequency power supplied to each radio-frequency antenna. With the plasma thus created with high uniformly, the sputtering process uniformly occurs over a wide area on the surface of the target T, so that the density of the sputtered particles in the vacuum container exhibits a high level of spatial uniformity.

Instead of the U-shaped antenna, an antenna that overhangs an area near the surface of the target T may be used, as described in the second embodiment.

Fourth Embodiment

Figure 8:
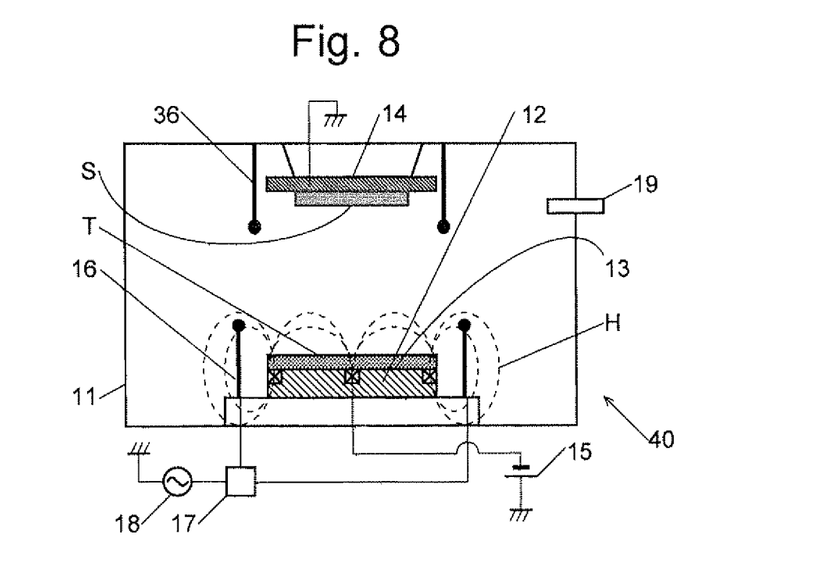
FIG. 8 is a vertical sectional view of a thin-film forming sputtering system 40 according to the fourth embodiment of the present invention.

FIG. 8 shows a plan view of a thin-film forming sputtering system 40 according to the fourth embodiment. The present embodiment is a variation of the thin-film forming sputtering system 10 of the first embodiment and additionally includes a substrate-activating radio-frequency antennae (the substrate-activating radio-frequency electromagnetic field generating means) 36 located in the vicinity of the substrate holder 14. Similar to the radio-frequency antenna 16, which corresponds to the radio-frequency inductively-coupled plasma generating means, each substrate-activating radio-frequency antenna 36 consists of a U-shaped conductive wire. Except for the use of these substrate-activating radio-frequency antennae 36, the thin-film forming sputtering system 40 according to the present embodiment has the same configuration as that of the thin-film forming sputtering system 10 of the first embodiment.

In the thin-film forming sputtering system 40 of the present embodiment, the surface of the target T is sputtered in a similar manner to the thin-film forming sputtering system 10 of the first embodiment. The particles sputtered from the surface fly through the space between the target T and the substrate S, and reach the surface of the substrate S. During this process, the substrate-activating radio-frequency antennae 36 create a radio-frequency electromagnetic field near the surface of the substrate S, whereby the surface of the substrate S is activated so as to promote the adhesion of the sputtered particles to the surface of the substrate S.

Instead of the U-shaped antenna, an antenna that overhangs an area near the surface of the target T may be used, as described in the second embodiment.

Figure 9:
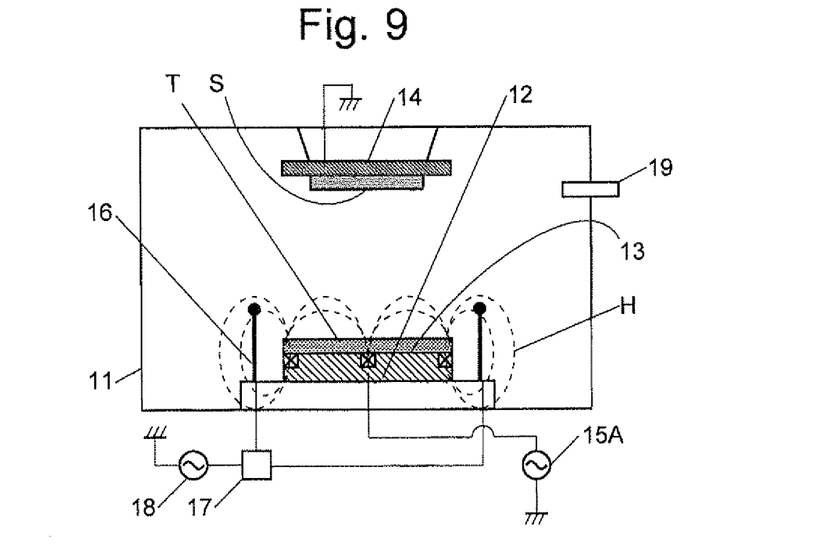
FIG. 9 is a vertical sectional view showing an example in which a radio-frequency voltage is applied between the target holder 13 and the substrate holder 14.

The present invention is not limited to the previously described first through fourth embodiments. For example, in any of the present embodiments, the target holder 13 and the substrate holder 14 are used as electrodes, between which a voltage is applied from the direct-current power source 15. Alternatively, it is possible to provide separate electrodes. Furthermore, as shown in FIG. 9, a radio-frequency power source 15A for applying a radio-frequency voltage between the target holder 13 and the substrate holder 14 may be used in place of the direct-current power source 15. The radio-frequency antennae may be provided in the vicinity of the short sides of the rectangular target T in addition to the long sides thereof. The target may have any shape other than a rectangle, such as a square-plate shape or block-like shape. The form of the radio-frequency antennae is not limited to those described in the first and second embodiments. For example, it is possible to use a U-shaped or semicircular radio-frequency antenna projecting from the inner surface of the ceiling or side wall of the vacuum container. For the magnetron-sputtering magnet 12, a permanent magnet may be used in place of the electromagnet.

EXPLANATION OF NUMERALS 10, 20, 30, 40 . . . Thin-Film Forming Sputtering System
11 . . . Vacuum Container
12 . . . Magnetron-Sputtering Magnet
13 . . . Target Holder
14 . . . Substrate Holder
15 . . . Direct-Current Power Source
15A . . . Radio-Frequency Power Source for Applying Radio-Frequency Voltage between Target Holder 13 and Substrate Holder 14
16, 26 . . . Radio-Frequency Antenna
161 . . . Leg of Radio-Frequency Antenna (First Conductor)
162 . . . Arm of Radio-Frequency Antenna (Second Conductor)
163 . . . Third Conductor
17 . . . Impedance Matching Unit
18 . . . Radio-Frequency Power Source
26A . . . First Radio-Frequency Antenna
26B . . . Second Radio-Frequency Antenna
26C . . . Third Radio-Frequency Antenna
36 . . . Substrate-Activating Radio-Frequency Antenna
S . . . Substrate
T . . . Target

The invention claimed is:

1. A thin-film forming sputtering system, comprising:
a) a vacuum container;
b) a target-holding means provided inside the vacuum container;
c) a substrate-holding means opposed to the target-holding means;
d) a plasma-generating gas introducing means for introducing a plasma-generating gas into the vacuum container;
e) an electric-field generating means for generating a direct-current electric field or radio-frequency electric field between the target-holding means and the substrate-holding means;
f) a magnetic-field generating means for generating a magnetic field on a sputter target held by the target-holding means, the magnetic field containing a component parallel to a surface of the sputter target; and
g) a radio-frequency inductively-coupled plasma generating means, which is a planar coil of a conductive wire whose number of turns is less than one, wherein a plane of the planar coil is placed on a side of the target holding means, for generating radio-frequency inductively-coupled plasma in a vicinity of the sputter target and within a space where the magnetic field being generated by the magnetic field generation means and having a strength equal to or higher than a strength necessary for producing a cycloid-trochoidal motion of electrons is present.

2. The thin-film forming sputtering system according to claim 1, wherein the radio-frequency inductively-coupled plasma generating means is a radio-frequency antenna.

3. The thin-film forming sputtering system according to claim 2, wherein the radio-frequency antenna is placed within a range where the magnetic field having a strength equal to or higher than the strength necessary for producing a cycloid-trochoidal motion of electrons is present.

4. The thin-film forming sputtering system according to claim 2, wherein the radio-frequency antenna is U-shaped or arc-shaped.

5. The thin-film forming sputtering system according to claim 1, wherein a plurality of radio-frequency inductively-coupled plasma generating means are provided.

6. The thin-film forming sputtering system according to claim 5, wherein a strength of a radio-frequency electromagnetic field generated by the plurality of radio-frequency inductively-coupled plasma generating means can be set to a different value for each of the radio-frequency inductively-coupled plasma generating means.

7. The thin-film forming sputtering system according claim 1, wherein the magnetic-field generating means is placed behind the target held by the target-holding means.

8. The thin-film forming sputtering system according to claim 1, further comprising a substrate-activating radio-frequency electromagnetic field generating means provided in a vicinity of the substrate-holding means, for generating a radio-frequency electromagnetic field in the vicinity of the substrate-holding means.

9. A thin-film forming sputtering system, comprising:
a) a vacuum container;
b) a target-holding means provided inside the vacuum container;
c) a substrate-holding means opposed to the target-holding means;
d) a plasma-generating gas introducing means for introducing a plasma-generating gas into the vacuum container;
e) an electric-field generating means for generating a direct-current electric field or radio-frequency electric field between the target-holding means and the substrate-holding means;
f) a magnetic-field generating means for generating a magnetic field on a sputter target held by the target-holding means, the magnetic field containing a component parallel to a surface of the sputter target; and
g) a radio-frequency inductively-coupled plasma generating means, which is provided so as to overhang an area in a vicinity of the surface of the sputter target from at least one side of the sputter target, for generating radio-frequency inductively-coupled plasma in a vicinity of the sputter target and within a space where the magnetic field being generated by the magnetic-field generation means and having a strength equal to or higher than a strength necessary for producing a cycloid-trochoidal motion of electrons is present.

10. The thin-film forming sputtering system according claim 9, wherein only a portion of the radio-frequency inductively-coupled plasma generating means overhangs the area in the vicinity of the surface of the sputter target.

\* \* \* \* \*